United States Patent
Li et al.

(10) Patent No.: US 9,136,805 B2
(45) Date of Patent: Sep. 15, 2015

(54) CLASS HD POWER AMPLIFIER

(71) Applicants: Dan Li, Shanghai (CN); Hui Shen, Shanghai (CN); Yang Pan, Shanghai (CN)

(72) Inventors: Dan Li, Shanghai (CN); Hui Shen, Shanghai (CN); Yang Pan, Shanghai (CN)

(73) Assignee: ANALOG DEVICES GLOBAL, Hamilton (BM)

( * ) Notice: Subject to any disclaimer, the term of this patent is extended or adjusted under 35 U.S.C. 154(b) by 150 days.

(21) Appl. No.: 14/039,208

(22) Filed: Sep. 27, 2013

(65) Prior Publication Data

US 2015/0091644 A1   Apr. 2, 2015

(51) Int. Cl.
*H03F 3/04* (2006.01)
*H03G 3/00* (2006.01)
*H03F 3/217* (2006.01)

(52) U.S. Cl.
CPC .................... *H03F 3/2175* (2013.01)

(58) Field of Classification Search
USPC ........................................ 330/297, 310, 127
IPC ...................................... H03F 3/04; H03G 3/00
See application file for complete search history.

(56) References Cited

U.S. PATENT DOCUMENTS

| | | | |
|---|---|---|---|
| 6,753,735 B2 * | 6/2004 | Arai et al. ...................... 330/297 |
| 7,130,415 B2 * | 10/2006 | Melsa et al. .............. 379/399.01 |
| 7,132,891 B1 * | 11/2006 | Dening et al. ................. 330/297 |
| 7,852,150 B1 * | 12/2010 | Arknaes-Pedersen .......... 330/10 |
| 2008/0007342 A1 * | 1/2008 | Lo et al. ......................... 330/297 |
| 2012/0068767 A1 * | 3/2012 | Henshaw et al. .............. 330/127 |
| 2014/0079096 A1 * | 3/2014 | Afsahi et al. ................... 375/219 |
| 2014/0132354 A1 * | 5/2014 | Briffa et al. .................... 330/297 |

* cited by examiner

*Primary Examiner* — Patricia T Nguyen
(74) *Attorney, Agent, or Firm* — Kenyon & Kenyon LLP

(57) ABSTRACT

A multi-level amplifier including a converter circuit being supplied with a supply voltage and operable to generate at least two output voltages, a voltage comparator circuit adapted to compare each of the output voltages with the supply voltage to generate a driving signal, and an amplifier circuit being supplied with an analog input signal, the amplifier circuit including an analog-to-digital converter coupled to a power stage driver and power stage, wherein the power stage driver receives the driving signal from the voltage comparator.

22 Claims, 6 Drawing Sheets

100

700

CLASS HD POWER AMPLIFIER

BACKGROUND OF THE INVENTION

The present invention relates generally to signal amplifiers and applications thereof. The accuracy of many electronic systems is degraded if amplifiers cannot supply currents that are sufficient to accurately amplify input signals. Several amplifier architectures have emerged, and amplifier designs can generally be designated according to an amplifier type or "class." In portable applications, class D and class H amplifiers are often considered.

A Class D or "switching" amplifier is an electronic amplifier in which power devices, such as MOSFETs, are operated as switches. In a typical class D amplifier, the power devices are operated as binary on/off switches. Here, the switching mode of transistors is used to regulate power output. As a result, the class D amplifier achieves high power conversion efficiency. However, a drawback of the class D amplifier is high out-of-band noise and excess electromagnetic interference.

Other amplifier types, such as class H, rely upon auto-adjusted linear power rails. Class H amplifiers operate by continuously boosting and lowering the power supply, as required, above a certain minimum bias level. Although the efficiency of class H amplifiers is lower than class D, class H devices achieve lower out-of-band noise and better EMI characteristics. However, because its performance is too dependent upon its built-in supply rails, class H amplifiers are seldom selected to drive speakers in high performance audio systems and other applications.

Accordingly, the inventors have recognized a need for improved amplifier designs that can be used is many applications, such as audio systems and other portable applications. For example, the inventors have provided a configuration that combines the advantages of class D and class H amplifiers having efficiency higher than class H and out-of-band noise and EMI that is significantly improved compared to class D.

DETAILED DESCRIPTION OF THE INVENTION

The embodiments of the present invention provide a multi-level amplifier including a converter circuit being supplied with a supply voltage and operable to generate at least two output voltages, a voltage comparator circuit adapted to compare each of the output voltages with the supply voltage to generate a driving signal, and an amplifier circuit being supplied with an analog input signal, the amplifier circuit including an analog-to-digital converter coupled to a power stage driver and power stage, wherein the power stage driver receives the driving signal from the voltage comparator.

Figure 1:
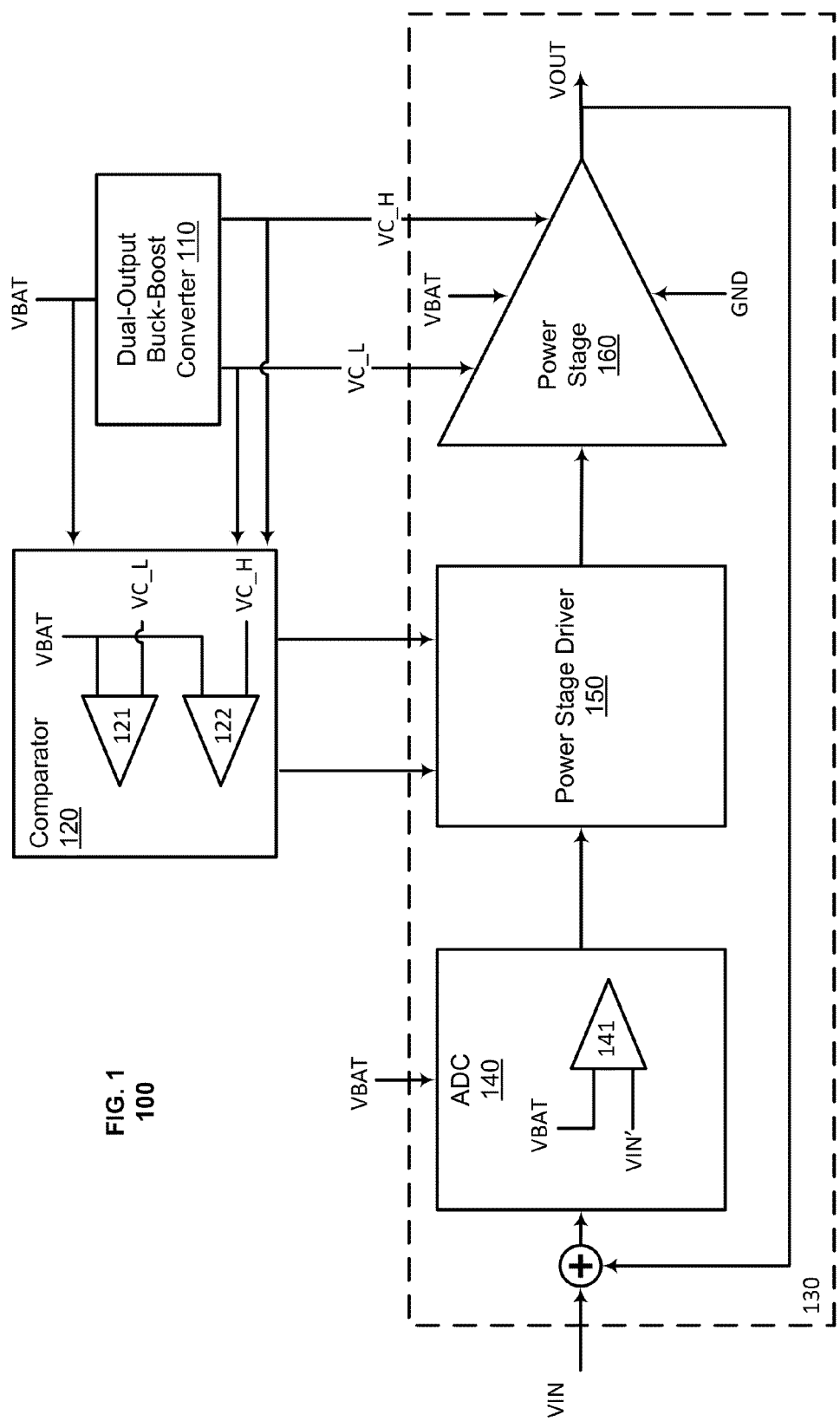
FIG. 1 illustrates a block diagram of a multi-level amplifier according to an example embodiment.

FIG. 1 illustrates a block diagram of a multi-level amplifier 100 according to an example embodiment. As shown in FIG. 1, the amplifier arrangement may include a dual-output buck-boost converter 110, a voltage comparator circuit 120, and amplifier circuit 130. The amplifier circuit 130 may include an analog-to-digital converter (ADC) 140, power stage driver 150, and power stage 160.

The buck-boost converter 110 is coupled to input battery voltage VBAT. The buck-boost converter 110 may produce an output voltage magnitude that is either greater than or less than an input voltage magnitude (i.e., VBAT). Here, high output voltage VC_H and low output voltage VC_L are the two output signals (i.e., boosted and bucked signals) of the buck-boost converter 110. Although VC_H and VC_L are not fixed voltages, VC_H is typically higher than VC_L. Example circuit configurations of buck-boost converter 110 will be discussed in connection with FIGS. 3 and 4.

Like the buck-boost converter 110, the comparator circuit 120 is also coupled to input battery voltage VBAT. In addition, the outputs VC_H and VC_L of buck-boost converter 110 are inputted to the comparator circuit 120 such that VC_H and VC_L may each be compared to battery voltage VBAT. For example, comparator 121 may compare input battery voltage VBAT to buck voltage VC_L, and comparator 122 may compare input battery voltage VBAT to boost voltage VC_H. The resulting signals of comparators 121 and 122 may then be supplied to the power stage driver 150 of amplifier circuit 130.

As discussed above and shown in FIG. 1, the amplifier circuit 130 may include an ADC circuit 140, power stage driver 150, and power stage 160. In advance of supplying the input signal VIN to the ADC circuit 140, a mixer integrates the input signal VIN with the output signal VOUT produced by power stage 160. The output signal VOUT is supplied to the mixer by a feedback loop.

The ADC circuit 140 can use one of several architectures, such as a flash, delta-sigma, pipelined, and successive approximation register (SAR) architectures. When the ADC circuit 140 may implement with delta-sigma architecture, the ADC circuit 140 generally includes an integrator (not shown) and a quantizer 141. The resulting signal of quantizer 141 may then be supplied to the power stage driver 150.

The ADC circuit 140 may output a plurality of voltage levels to be supplied to the power stage driver 150. For example, the ADC circuit 140 may output seven levels: +3, +2, +1, 0, −1, −2 and −3. In another example, the ADC circuit 140 may output five levels: +2, +1, 0, −1 and −2. In the 5-level ADC implementation, the response time of the buck-boost converter 110 will be slightly faster compared to the 7-level implementation. However, the resulting system efficiency will be a slightly lower because the output power would be provided by the buck-boost converter 110 (i.e., not from VBAT directly).

The power stage driver 150 receives comparison signals from comparators 121 and 122 of comparator circuit 120 as well as a comparison signal from quantizer 141 of ADC circuit 140 to generate a plurality of gate control signals that control the switching elements of power stage 160.

The example power stage 160 may include a plurality of switching elements arranged in an H-bridge configuration. In this example arrangement, each side of the H-bridge includes a plurality of PMOS transistors. For example, on each side of the H-bridge configuration, three PMOS transistors may be connected to VC_H, VC_L, and VBAT respectively. In another example, on each side of the H-bridge configuration, two PMOS transistors may be connected to VC_H and VC_L, respectively. In either example, each side of the H-bridge is also coupled to ground through an NMOS transistor.

Figure 2:
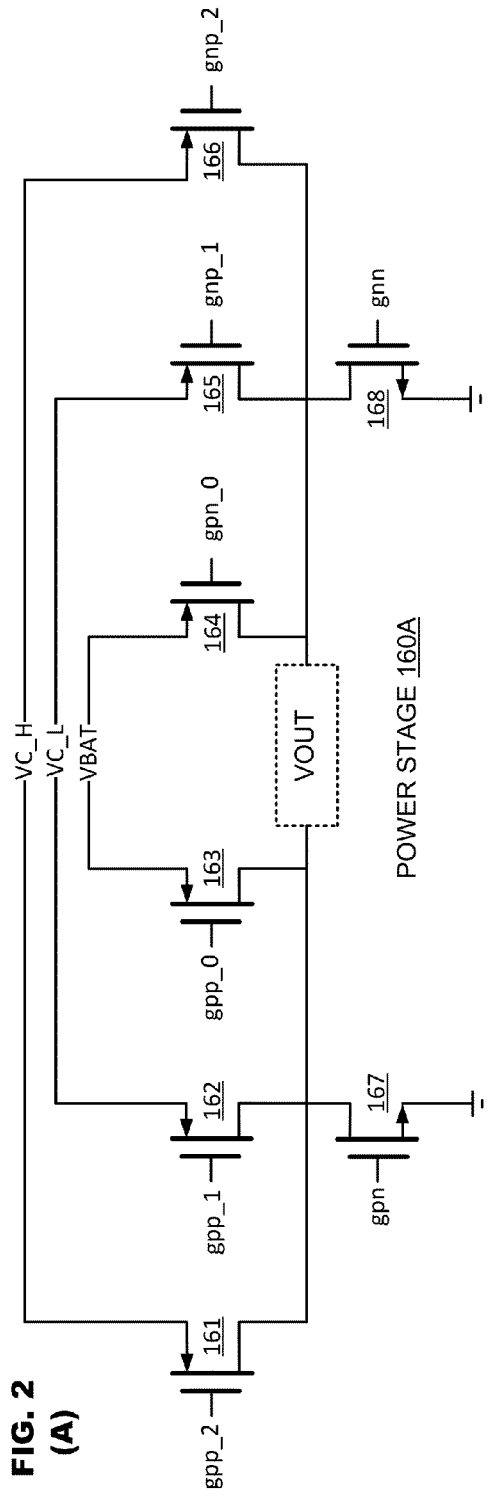
FIG. 2A illustrates a circuit schematic of a power stage according to an example embodiment.
FIG. 2B illustrates a circuit schematic of an alternative power stage according to another example embodiment.
Figure 2:
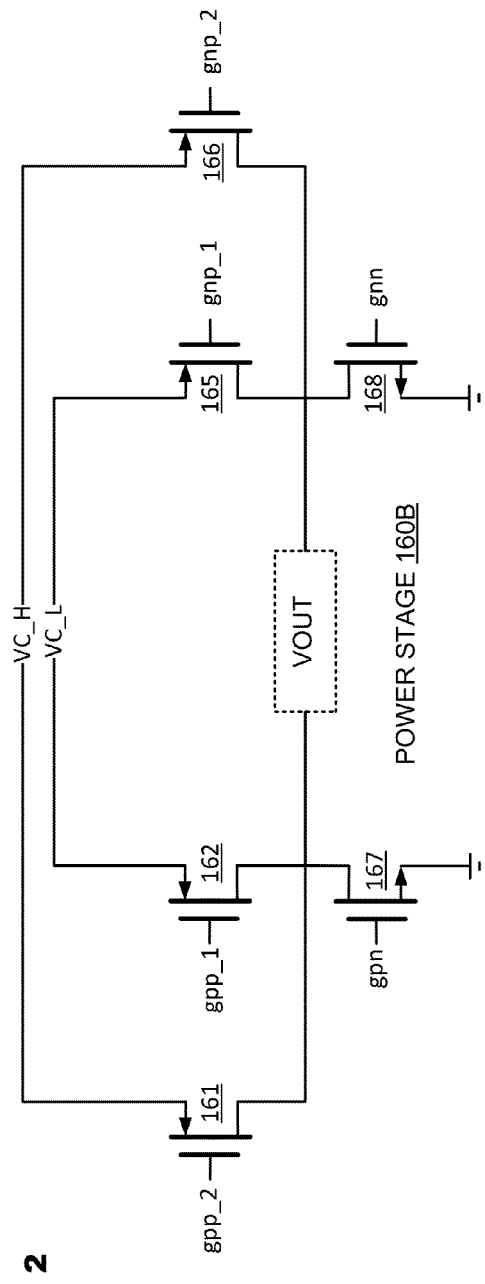

FIG. 2A illustrates a circuit schematic of a power stage 160 according to an example embodiment.

The example power stage 160A may include a plurality of PMOS and NMOS switching elements 161-168 arranged in an H-bridge configuration. In this example configuration, each side of the H-bridge includes three PMOS transistors 161-163 and 164-166, respectively. On each side of the H-bridge arrangement, three PMOS transistors 161-163 and 164-166 are connected to VC_H, VC_L, and VBAT respectively. In addition, each side of the H-bridge is also coupled to ground through one NMOS transistor 167 and 168, respectively.

The power stage 160A, as depicted in FIG. 2A, may be coupled to a 7-level ADC circuit through power stage circuit 150. Here, the ADC circuit 140 outputs 7 levels: +3, +2, +1, 0, −1, −2 and −3.

The operation of power stage 160A will now be explained in connection with a plurality of example cases. In the examples, positive ADC outputs are described, but it is understood that when the ADC outputs a corresponding negative value, the corresponding transistor is turned "on" at the opposing side of the H-bridge configuration (e.g., in case 1, an ADC output of "−3" would cause PMOS transistor 166 to be turned "on" by activating gate control signal gnp_2). Also, an ADC output of "0" causes the NMOS transistors 167 and 168 connected to ground to be turned "on" by applying gate control signals gpn and gnn.

When VC_H>VC_L>VBAT (case 1): an ADC output of "3" causes PMOS transistor 161 connected to VC_H to be turned "on" by applying the corresponding gate control signal gpp_2; an ADC output of "2" causes the PMOS transistor 162 connected to VC_L to be turned "on" by applying gate control signal gpp_1; and an ADC output of "1" causes the PMOS transistor 163 connected to VBAT to be turned "on" by applying gate control signal gpp_0.

When VC_H>VBAT>VC_L (case 2): an ADC output of "3" causes PMOS transistor 161 connected to VC_H to be turned "on" by applying the corresponding gate control signal gpp_2; an ADC output of "2" causes PMOS transistor 163 connected to VBAT to be turned "on" by applying the corresponding gate control signal gpp_0; and an ADC output of "1" causes the PMOS transistor 162 connected to VC_L to be turned "on" by applying gate control signal gpp_1.

When VBAT>VC_H>VC_L (case 3): an ADC output of "3" causes PMOS transistor 163 connected to VBAT to be turned "on" by applying the corresponding gate control signal gpp_0; an ADC output of "2" causes PMOS transistor 161 connected to VC_H to be turned "on" by applying the corresponding gate control signal gpp_2; and an ADC output of "1" causes the PMOS transistor 162 connected to VC_L to be turned "on" by applying gate control signal gpp_1.

Because the switching range is small, the output EMI of Class HD power amplifier is improved compared to Class D amplifier. For example, when the output amplitude is low, the output voltage VOUT will switch between GND and VC_L. Here, the switching range is small because VC_L is low at that time. Similarly, when the output amplitude is higher, VC_H>VC_L>VBAT or VBAT>VC_H>VC_L, the output voltage VOUT will switch between VC_H and VC_L in most cases. The switching range remains small in this case as well.

When VC_H>VBAT>VC_L, the output voltage VOUT will switch between VC_H and VBAT or between VBAT and VC_L. Again, the switching range is small here too.

FIG. 2B illustrates a circuit schematic of an alternative power stage 160B according to another example embodiment.

The example power stage 160B may include a plurality of switching elements 161, 162, and 165-168 arranged in an H-bridge configuration. In this example arrangement, each side of the H-bridge includes two PMOS transistors 161-162 and 165-166, respectively. On each side of the H-bridge arrangement, two PMOS transistors 161-162 and 165-166 are connected to VC_H and VC_L, respectively. In addition, each side of the H-bridge is also coupled to ground through one NMOS transistor 167 and 168, respectively. The power stage depicted in FIG. 2B is the similar to that of FIG. 2A, except the PMOS transistor pair connected to VBAT (i.e., PMOS transistors 163 and 164) is not included.

The simplified power stage 160B, as depicted in FIG. 2B, may be coupled to a 5-level ADC circuit through power stage circuit 150. Here, the ADC circuit 140 outputs 5 levels: +2, +1, 0, −1, and −2.

Figure 3:
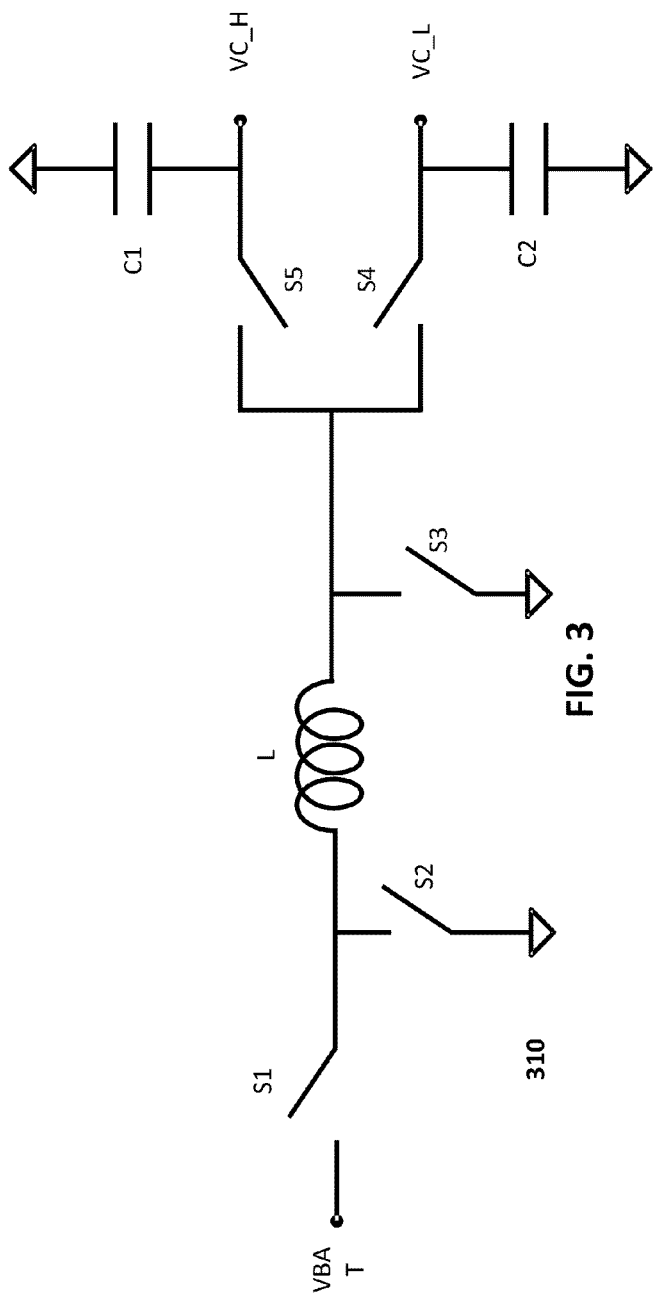
FIG. 3 is a circuit schematic depicting a power stage of a two output buck-boost converter according to an example embodiment.

For power stage 160B, an ADC output of "2" causes PMOS transistor 161 connected to VC_H to be turned "on" by applying the corresponding gate control signal gpp_2; an ADC output of "1" causes the PMOS transistor 162 connected to VC_L to be turned "on" by applying gate control signal gpp_1; and an ADC output of "0" causes the NMOS transistors 167 and 168 connected to ground to be turned "on" by applying gate control signals gpn and gnn FIG. 3 is a circuit schematic depicting a power stage of a two output buck-boost converter 310 according to an example embodiment.

Different types of DC voltage converters exist. A boost converter receives an input voltage and produces an output voltage having a magnitude greater than that of the input voltage. Conversely, a buck converter produces an output voltage having a magnitude less than that of the input voltage.

A buck-boost converter can produce an output voltage magnitude that is either greater than or less than an input voltage magnitude. Buck-boost converters can be useful in battery-powered electronic products. Circuits in such products may be designed to use a predetermined supply-voltage magnitude range. For example, when a battery is fresh, it may supply a voltage magnitude higher than the predetermined range, and when the battery is more depleted, it may supply a voltage magnitude lower than the range. Thus, both buck and boost conversion is needed.

As shown in FIG. 3, buck-boost converter 310 includes a plurality of switches S1-S5, inductor L, and capacitors C1 and C2. Buck-boost converter 310 is coupled to input battery voltage VBAT, and generates two output voltages having magnitudes greater than and/or less than VBAT, i.e., output voltages VC_H and VC_L.

The buck-boost converter 310 is capable of operating in any of a buck mode, a boost mode or a buck-boost mode. In the boost mode, the magnitude of the output voltages VC_H and VC_L can vary only in the range of being greater than or equal to the magnitude of the input voltage VBAT as a result of variation of a duty cycle of switching signals provided to the switches. In buck mode, the magnitude of the output voltages VC_H and VC_L can vary only in the range of being less than or equal to the magnitude of the input voltage VBAT as a result of variation of the duty cycle of switching signals provided to the switches. In buck-boost mode, the magnitude of the output voltages VC_H and VC_L can vary in the range of being either less than, equal to, or greater than the magnitude of the input voltage VBAT as a result of variation of the duty cycle of switching signals provided to the switches.

During boost mode operation (i.e., both VC_H and VC_L are higher than VBAT), switch S1 is turned on, and switch S2 is turned off. In addition, inductor L is charged when switch S3 is turn-on, and is discharged when either switch S4 or S5 is turn on. In buck mode (i.e., both VC_H and VC_L are lower than VBAT), switch S3 is turned off. In addition, switches S1 and S5 (or S4) are turned on when L is charged, and switches S2 and S5 (or S4) are turn on when L is discharged. Lastly, in buck-boost mode (i.e., VC_H>VBAT and VC_L<VBAT), the inductor L is charged when switches S1 and S3 are turn-on and discharged when switches S2 and S5 (or S4) are turn on.

Figure 4:
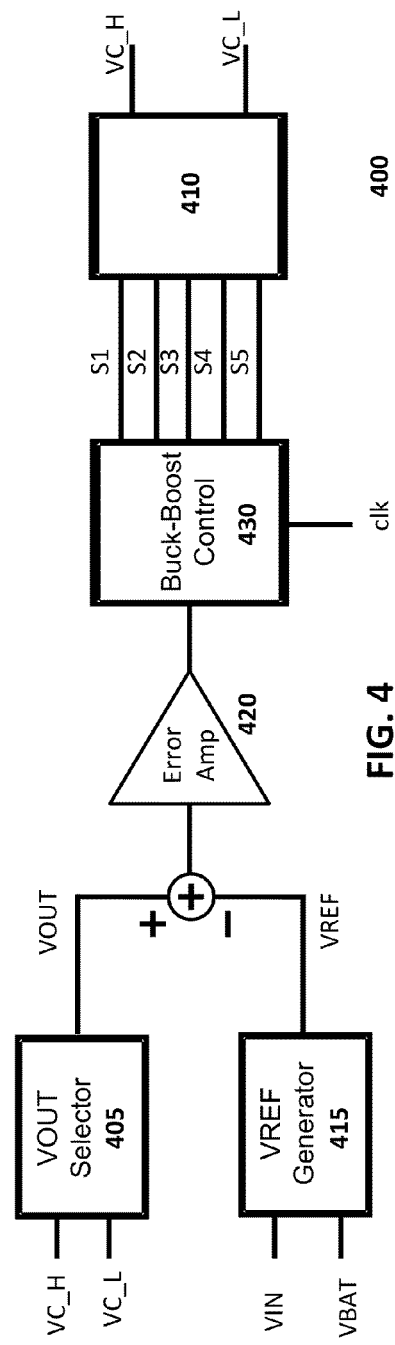
FIG. 4 is a block diagram of a control loop for the dual-output buck-boost converter of FIG. 3.

FIG. 4 is a block diagram of a control loop 400 for the dual-output buck-boost converter 310 of FIG. 3. The control loop 400 includes output selector 405, reference voltage generator 415, error amplifier 420, and buck boost controller 430 to drive buck-boost converter 410.

Each of output voltages VC_H and VC_L may be selected by selector 405 and compared with a reference voltage VREF. Here, reference voltage VREF increases with input signal VIN. In addition, reference voltage VREF is used to control output voltages VC_H and VC_L such that VC_H is higher than the expected output amplitude and VC_L is lower than the expected output amplitude. Subsequently, error amplifier 420 may be used to provide high open-loop gain such that the difference between VOUT and VREF is reduced. Using the difference signal and a clock signal as inputs, the buck-booster controller 430 provides switching signals to switches S1-S5 of buck-boost converter 410.

Figure 5:
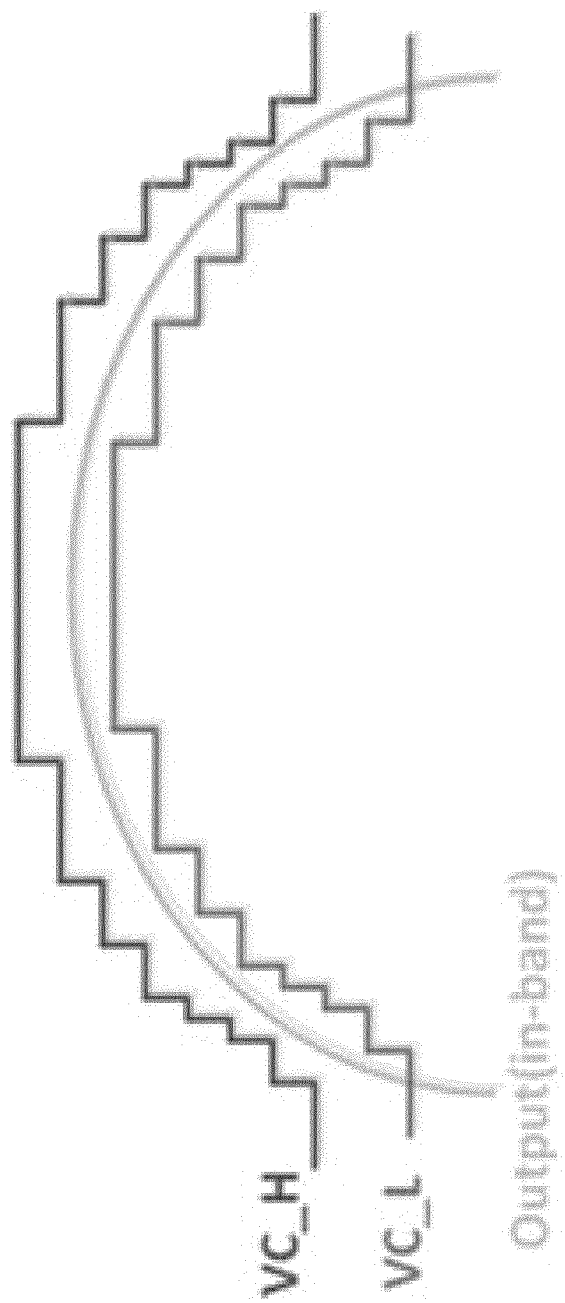
FIG. 5 illustrates an example simulated output voltage pattern generated from an amplifier according to an embodiment.
Figure 6:
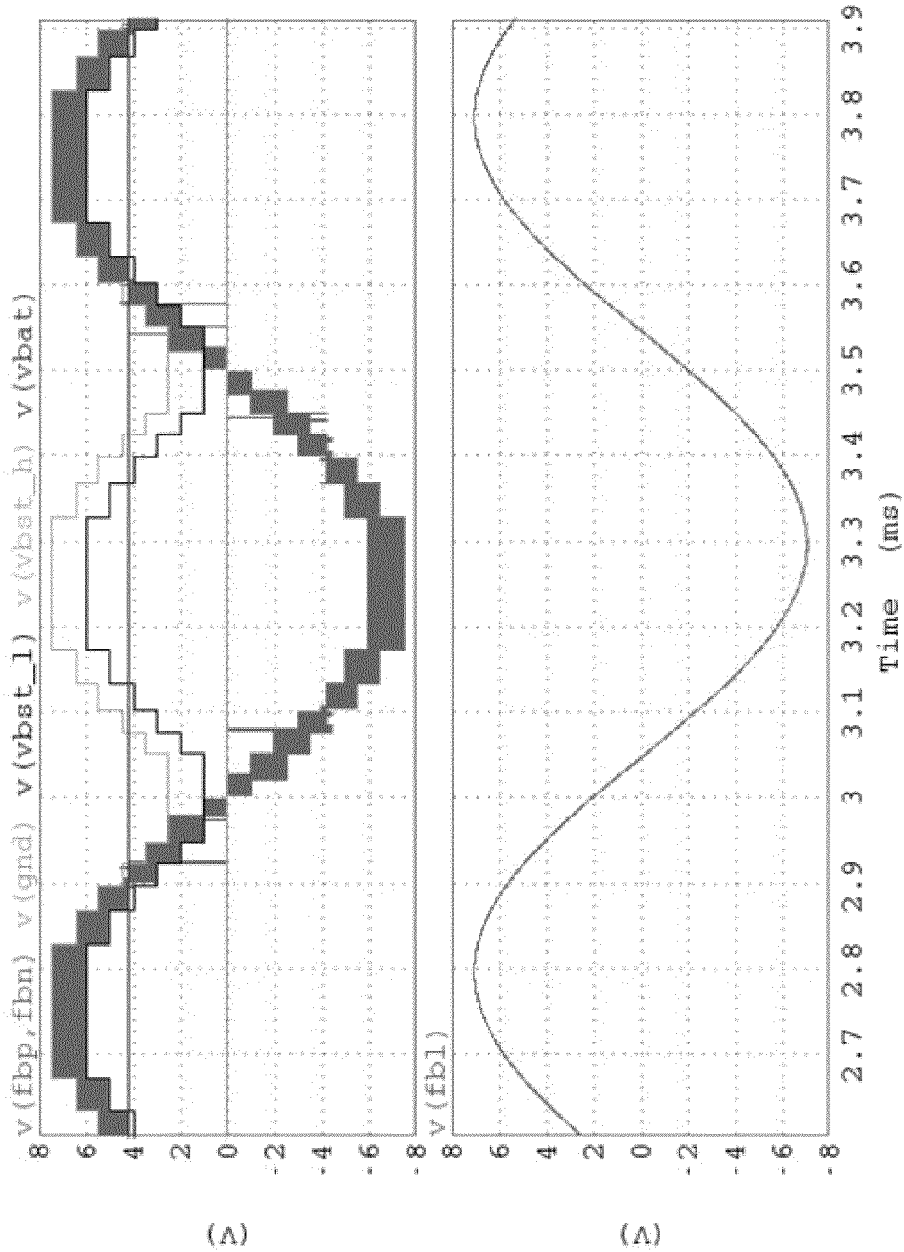
FIG. 6 illustrates an example simulated output voltage pattern generated from an amplifier according to an embodiment.

FIG. 5 illustrates an example simulated output voltage pattern generated from an amplifier according to an embodiment. As discussed above, the buck-boost converter 110 produces dual-outputs VC_H and VC_L. Voltages VC_H and VC_L are not fixed, but VC_H should remain greater than VC_L. In addition, the multi-level amplifier output voltage VOUT should remain within the in-band formed between VC_H and VC_L, as depicted in FIG. 5. FIG. 6 illustrates an example simulated output voltage pattern generated from a multi-level amplifier according to an example embodiment.

Figure 7:
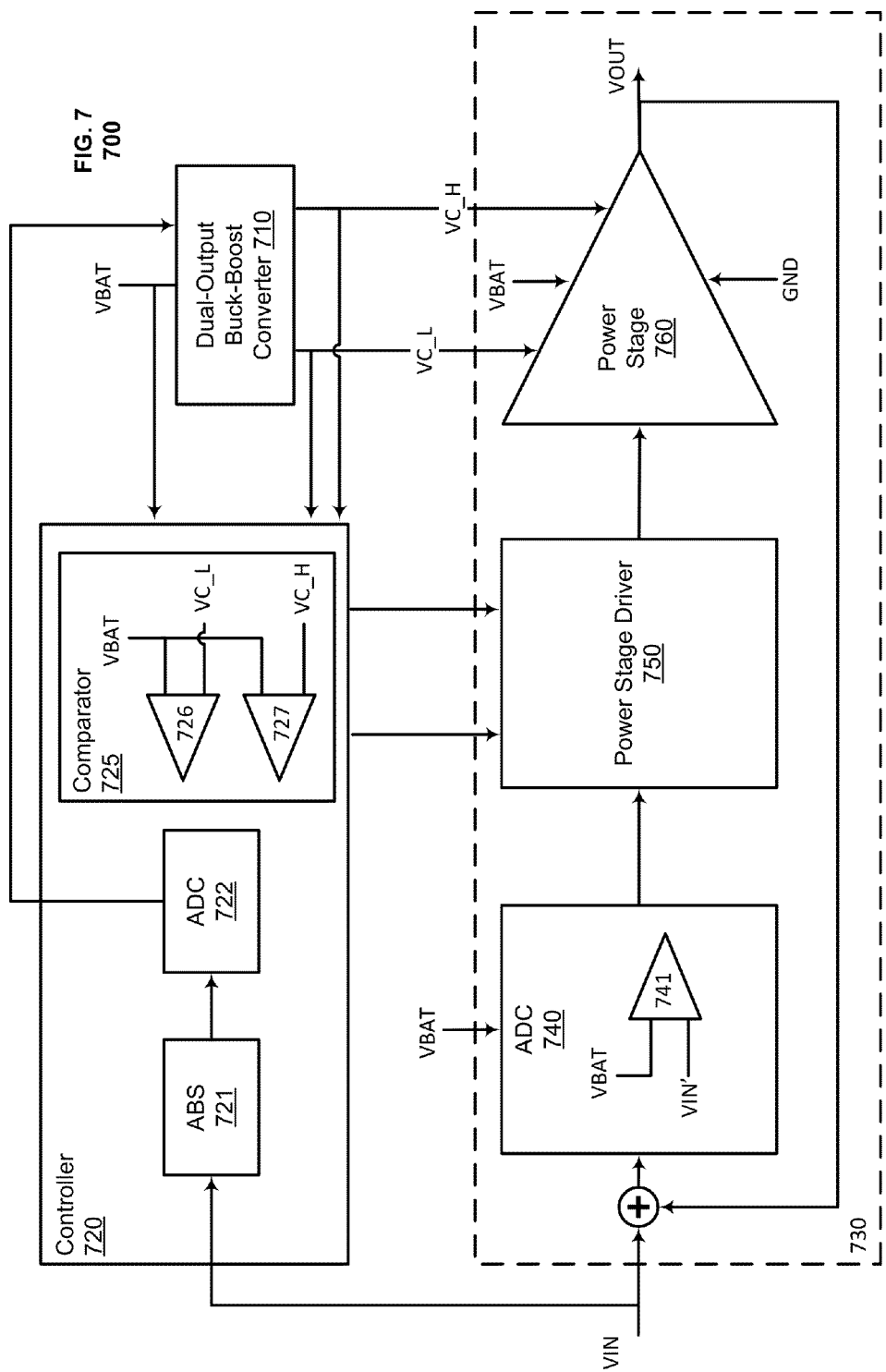
FIG. 7 illustrates another block diagram of a multi-level amplifier according to another example embodiment.

FIG. 7 illustrates a block diagram of another multi-level amplifier 700 according to another example embodiment. As shown in FIG. 7, the amplifier arrangement may include a dual-output buck-boost converter 710, controller 720, and amplifier circuit 730. The controller 720 may include a magnitude detector 721, low resolution ADC 722, and a voltage comparator circuit 725. The amplifier circuit 730 may include an ADC 740, power stage driver 750, and power stage 760.

The buck-boost converter 710 is coupled to input battery voltage VBAT. The buck-boost converter 710 may produce an output voltage magnitude that is either greater than or less than an input voltage magnitude (i.e., VBAT). Here, high output voltage VC_H and low output voltage VC_L are the two output signals (i.e., boosted and bucked signals) of the buck-boost converter 710. Although VC_H and VC_L are not fixed voltages, VC_H is typically higher than VC_L. Example circuit configurations of buck-boost converter 710 are discussed in connection with FIGS. 3 and 4.

Within controller 720, magnitude detector 722 is coupled to input signal VIN such that the absolute value or magnitude of the input signal VIN is measured and supplied to a low resolution ADC 722. The output of ADC 722 may be supplied to buck-boost converter 710 so that the outputs VC_L and VC_H may be adjusted according to the output of the low-resolution ADC 722 (i.e., that corresponds to input signal VIN).

Also within controller 720, the comparator circuit 725 is coupled to input battery voltage VBAT. Outputs VC_H and VC_L of buck-boost converter 710 are inputted to the comparator circuit 725 such that VC_H and VC_L may each be compared to battery voltage VBAT. For example, comparator 726 may compare input battery voltage VBAT to buck voltage VC_L, and comparator 727 may compare input battery voltage VBAT to boost voltage VC_H. The resulting signals of comparators 726 and 727 may then be supplied to the power stage driver 750 of amplifier circuit 730.

As discussed above and shown in FIG. 7, the amplifier circuit 730 may include an ADC circuit 740, power stage driver 750, and power stage 760. In advance of supplying the input signal VIN to the ADC circuit 740, a mixer integrates the input signal VIN with the output signal VOUT produced by power stage 760. The output signal VOUT is supplied to the mixer by a feedback loop.

The ADC circuit 740 can use one of several architectures, such as a flash, delta-sigma, pipelined, and successive approximation register (SAR) architectures. When the ADC circuit 740 may implement with delta-sigma architecture, the ADC circuit 740 generally includes an integrator (not shown) and a quantizer 741. The resulting signal of quantizer 741 may then be supplied to the power stage driver 750.

The ADC circuit 740 may output a plurality of voltage levels to be supplied to the power stage driver 750. For example, the ADC circuit 740 may output seven levels: +3, +2, +1, 0, −1, −2 and −3. In another example, the ADC circuit 740 may output five levels: +2, +1, 0, −1 and −2. In the 5-level ADC implementation, the response time of the buck-boost converter 710 will be slightly faster compared to the 7-level implementation. However, the resulting system efficiency will be a slightly lower because the output power would be provided by the buck-boost converter 710 (i.e., not from VBAT directly).

The power stage driver 750 receives comparison signals from comparators 726 and 727 of comparator circuit 725 as well as a comparison signal from quantizer 741 of ADC circuit 740 to generate a plurality of gate control signals that control the switching elements of power stage 760.

The example power stage 760 may include a plurality of switching elements arranged in an H-bridge configuration. In this example arrangement, each side of the H-bridge includes a plurality of PMOS transistors. For example, on each side of the H-bridge configuration, three PMOS transistors may be connected to VC_H, VC_L, and VBAT respectively. In another example, on each side of the H-bridge configuration, two PMOS transistors may be connected to VC_H and VC_L, respectively. In either example, each side of the H-bridge is also coupled to ground through an NMOS transistor.

Accordingly, an improved amplifier design is provided. The class HD amplifier described herein can be used is many applications, such as audio systems and other portable applications. Compared with a traditional boosted Class D amplifier, the die cost and system complexity for Class HD power amplifier are not significantly increased (nominal increase, at most). In addition, the EMI and out-of-band noise properties are greatly improved. Moreover, the number of amplifier output levels are no longer limited by the number of power devices in the class D power stage.

Several embodiments of the present invention are specifically illustrated and described herein. However, it will be appreciated that modifications and variations of the present invention may be covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A multi-level amplifier, comprising:
a converter circuit being supplied with a supply voltage and operable to generate at least two output voltages;
a voltage comparator circuit adapted to compare each of the output voltages with the supply voltage to generate a driving signal; and
an amplifier circuit being supplied with an analog input signal, the amplifier circuit including an analog-to-digital converter coupled to a power stage driver and power stage,
wherein the power stage driver receives the driving signal from the voltage comparator.

2. The multi-level amplifier according to claim 1, wherein the converter circuit is a dual-output buck-boost converter that generates output voltages that are both greater than and less than the supply voltage magnitude.

3. The multi-level amplifier according to claim 1, wherein the analog-to-digital converter is implemented using a delta-sigma architecture.

4. The multi-level amplifier according to claim 1, wherein the analog-to-digital converter further includes a quantizer.

5. The multi-level amplifier according to claim 1, wherein the amplifier circuit further includes a feedback loop between the output of the power stage and the input of the analog-to-digital converter.

6. The multi-level amplifier according to claim 1, wherein the analog-to-digital converter outputs five or seven digital data levels.

7. The multi-level amplifier according to claim 1, wherein the power stage includes a plurality of switching elements arranged in an H-bridge configuration.

8. The multi-level amplifier according to claim 7, wherein each side of the H-bridge arrangement includes a PMOS transistor coupled to each of the output voltages.

9. The multi-level amplifier according to claim 7, wherein each side of the H-bridge arrangement includes PMOS transistors coupled to each of the output and supply voltages.

10. The multi-level amplifier according to claim 1, wherein the analog input signal is an audio signal.

11. A multi-level amplifier, comprising:
a converter circuit being supplied with a supply voltage and operable to generate at least two output voltages;
a controller circuit being supplied with an analog input signal and the supply voltage, the controller including a magnitude detector coupled to a first analog to digital converter, and a voltage comparator circuit adapted to compare each of the output voltages with the supply voltage to generate a driving signal; and
an amplifier circuit being supplied with an analog input signal, the amplifier circuit including a second analog-to-digital converter coupled to a power stage driver and power stage,
wherein the power stage driver receives the driving signal from the voltage comparator.

12. The multi-level amplifier according to claim 11, wherein the converter circuit is a dual-output buck-boost converter that generates output voltages that are both greater than and less than the supply voltage magnitude.

13. The multi-level amplifier according to claim 11, wherein the second analog-to-digital converter is implemented using a delta-sigma architecture.

14. The multi-level amplifier according to claim 11, wherein the second analog-to-digital converter further includes a quantizer.

15. The multi-level amplifier according to claim 11, wherein the amplifier circuit further includes a feedback loop between the output of the power stage and the input of the second analog-to-digital converter.

16. The multi-level amplifier according to claim 11, wherein the second analog-to-digital converter outputs five or seven digital data levels.

17. The multi-level amplifier according to claim 11, wherein the power stage includes a plurality of switching elements arranged in an H-bridge configuration.

18. The multi-level amplifier according to claim 17, wherein each side of the H-bridge arrangement includes a PMOS transistor coupled to each of the output voltages.

19. The multi-level amplifier according to claim 17, wherein each side of the H-bridge arrangement includes PMOS transistors coupled to each of the output and supply voltages.

20. The multi-level amplifier according to claim 11, wherein the analog input signal is an audio signal.

21. The multi-level amplifier according to claim 11, wherein the output voltages of the converter circuit are adjusted according to the first analog-to-digital converter.

22. The multi-level amplifier according to claim 11, wherein the first analog-to-digital converter is implemented using a low resolution architecture.

* * * * *